US006906397B2

(12) United States Patent
Hsieh et al.

(10) Patent No.: US 6,906,397 B2
(45) Date of Patent: Jun. 14, 2005

(54) IMAGE SENSOR HAVING AN IMPROVED TRANSPARENT LAYER

(75) Inventors: Jackson Hsieh, Hsinchu Hsien (TW); Jichen Wu, Hsinchu Hsien (TW); Channing Wel, Hsinchu Hsien (TW); Bird Lin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 153 days.

(21) Appl. No.: 10/621,992

(22) Filed: Jul. 16, 2003

(65) Prior Publication Data

US 2005/0012170 A1 Jan. 20, 2005

(51) Int. Cl.[7] .......................................... H01L 31/0203
(52) U.S. Cl. ....................................... 257/434; 257/433
(58) Field of Search ................................ 257/431, 433, 257/434

*Primary Examiner*—David A. Zarneke
(74) *Attorney, Agent, or Firm*—Pro-Techtor International Services

(57) ABSTRACT

An image sensor having an improved transparent layer includes a substrate, a frame layer, a photosensitive chip, a plurality of wires, and a transparent layer. The substrate has an upper surface formed with a plurality of first connected points. The frame layer is arranged on the upper surface of the substrate so as to form a cavity together with the substrate. The photosensitive chip is mounted on the upper surface of the substrate and within the cavity. The plurality of wires are electrically connected the photosensitive chip to the first connected point of the substrate. The transparent layer is covered on the frame layer for covering the photosensitive chip so that the photosensitive chip may receive optical signals passing through the transparent layer, respectively, at the peripheries of the transparent layer are formed with cut—corners. Therefore, the transparent layer may be decreased collision and may be increased the cleanness of the transparent layer, therefore, simplifying the manufacturing processes and decreasing the manufacturing cost.

5 Claims, 2 Drawing Sheets

60 48 46 66 44 64 49 42 56 52 40 59 62 70 68 58 54

IMAGE SENSOR HAVING AN IMPROVED TRANSPARENT LAYER

BACKGROUND OF THE INVENTION

1. Field of the Invention

The invention relates to an image sensor having an improved transparent layer, and in particular to an image sensor that has an improved transparent layer, and may be manufactured more conveniently.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 12, a photosensitive chip 14, a plurality of wires 15, and a transparent layer 22. The substrate 10 has an upper surface 11 on which first terminals 18 are formed, and a lower surface 13 on which second terminals 24 are formed. The frame layer 12 is adhered to the upper surface 11 of the substrate 10 to form a cavity 16 together with the substrate 10. The photosensitive chip 14 is arranged within the cavity 14 and is mounted to the upper surface 11 of the substrate 10. Each wire 28 are electrically connected the correspondingly bonding pad of the photosensitive chip 14. The transparent layer 22 is adhered to the frame layer 12 to cover the photosensitive chip 14 so as to the photosensitive chip 14 may received optical signals passing through the transparent layer22.

However, the image sensor has to be manufactured in a clean room in order to prevent the particles from entering the cavity 16 and covering the transparent layer22, thus, the quality of the image sensor may be increased.

As shown in FIG. 2 which is a conventional schematic illustrate showing a method for manufacture the transparent layer of the image sensor, firstly, providing a piece of transparent layer21, then, providing a cutter cutting the transparent layer21 along the saw lines25. Please referring to FIG. 3, a transparent layer 22 is manufactured, therefore, the periphery of the transparent layer22 are formed in a right angle.

However, the above-mentioned of the transparent layer22 has following advantages. The peripheries of transparent layer22 is easily damaged, and collision occurred during the transportation may damage or peel off the corners of the transparent layer22, and the cleanness of the transparent layer22 is influenced.
Therefore, the transparent layer22 have to be wiped and inspected again before the encapsulation thereof, thereby complicating the manufacturing processes and increasing the manufacturing cost.

SUMMARY OF THE INVENTION

An object of the present invention is to provide an image sensor having an improved transparent layer, which has cut-corner formed in the periphery of the transparent layer, and may be decreased collision and may be increased the cleanness of the transparent layer, therefore, simplifying the manufacturing processes and decreasing the manufacturing cost.

To achieve the above-mentioned object, the present invention provides an image sensor including a substrate, a frame layer, a photosensitive chip, a plurality of wires, and a transparent layer. The substrate has an upper surface formed with a plurality of first connected points projecting over the upper surface. The frame layer is arranged on the upper surface of the substrate so as to form a cavity together with the substrate. The photosensitive chip is formed with a plurality of bonding pads, and is mounted on the upper surface of the substrate and within the cavity. The plurality of wires are electrically connected the bonding pad of the photosensitive chip to the first connected point of the substrate. The transparent layer is covered on the frame layer for covering the photosensitive chip so that the photosensitive chip may receive optical signals passing through the transparent layer, respectively, at the peripheries of the transparent layer are formed with cut-corners.

Therefore, the transparent layer may be decreased collision and may be increased the cleanness of the transparent layer, therefore, simplifying the manufacturing processes and decreasing the manufacturing cost.

DETAILED DESCRIPTION OF THE INVENTION

Figure 1:
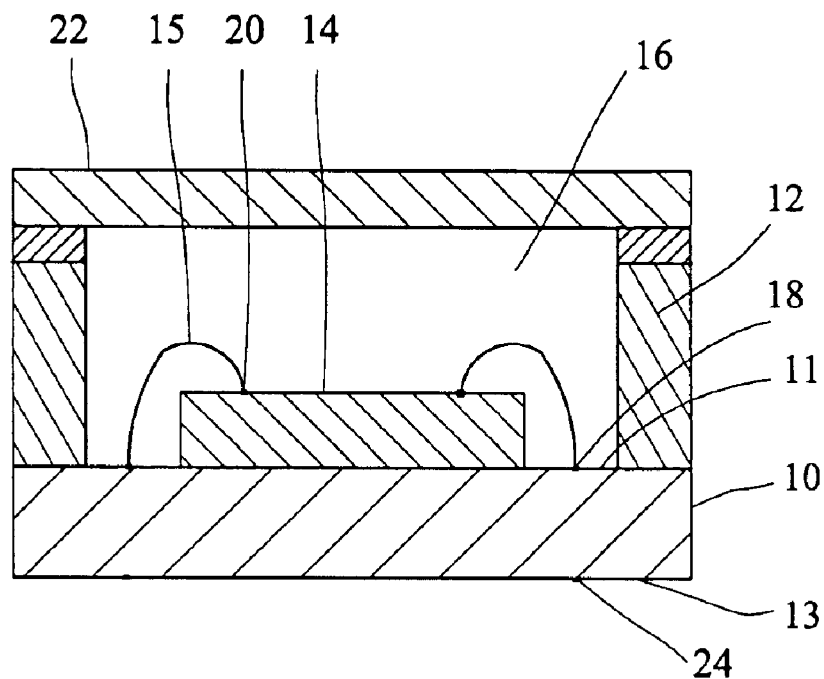
FIG. 1 is a cross-sectional view showing a conventional an image sensor.
Figure 2:
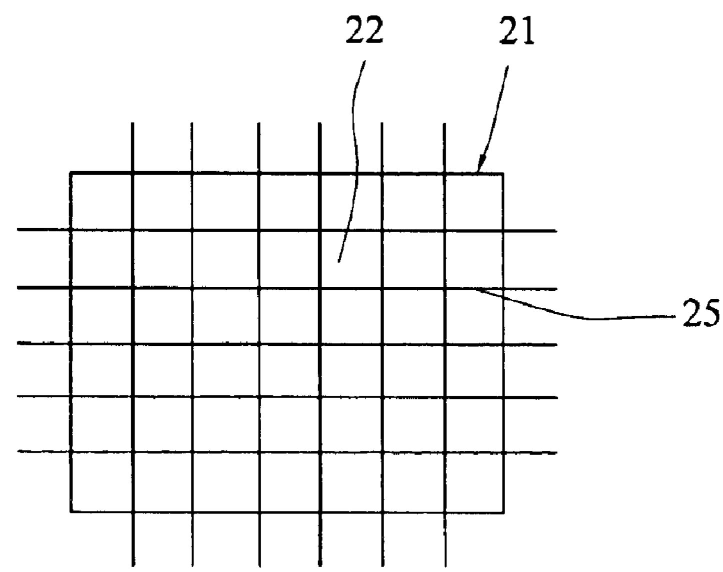
FIG. 2 is a schematic illustrate showing a conventional method of manufacturing the transparent layer of an image sensor.
Figure 3:
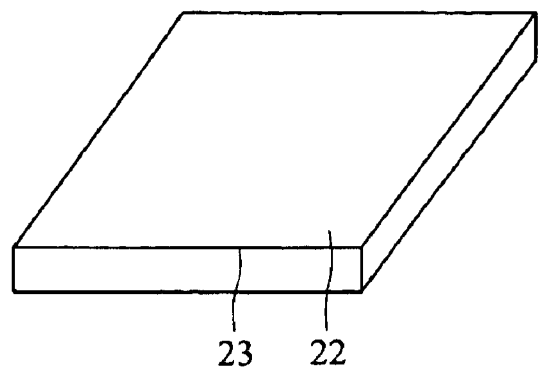
FIG. 3 is a pictorial view showing a conventional transparent layer of an image sensor.
Figure 4:
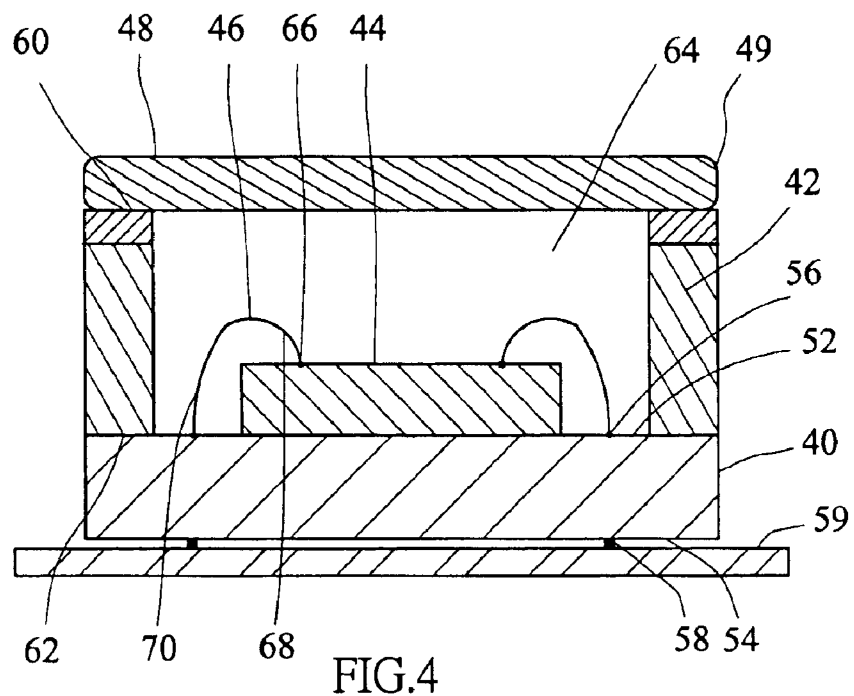
FIG. 4 is a cross-sectional view showing an image sensor of the present invention.

Please referring to FIG. 4, an image sensor of the present invention includes a substrate 40, a frame layer 42, a photosensitive chip 44, a plurality of wires 46 and a transparent layer 48.

The substrate 40 has an upper surface 52 and a lower surface 54. The upper surface 52 is formed with a plurality of first terminals 56 projecting over the upper surface 52, and the lower surface 54 is formed with a plurality of second terminals 58 for electrically connecting to a printed circuit board 59.

The frame layer42 has a first surface60 and a second surface62, the second surface62 of the frame layer42 is adhered on the upper surface52 of the substrate40 so as to form a cavity64 together with the substrate40.

The photosensitive chip44 is formed with a plurality of bonding pads66, and is mounted on the upper surface52 of the substrate40*e* and within the cavity64.

The plurality of wires46, each of which has a first terminal68 and a second terminal70, the terminal 68 of the wires46 are electrically connected the bonding pad 66 of the photosensitive chip44, the second terminal70 of the wires46 are electrically connected to the first connected point56 of the substrate40, respectively.

The transparent layer48 is a piece of transparent glass, at the periphery of the transparent layer48 is formed with cut-corner49, which are a spherical-shaped.
The transparent layer48 is covered on the first surface 60 of the frame layer42 for covering the photosensitive chip44 so that the photosensitive chip44 may receive optical signals passing through the transparent layer48.

Consequently, the periphery of the transparent layer48 are formed with cut-corner49, so that the transparent layer48 may be decreased collision and may be increased the cleanness of the transparent layer48, therefore, simplifying the manufacturing processes and decreasing the manufacturing cost.

Figure 5:
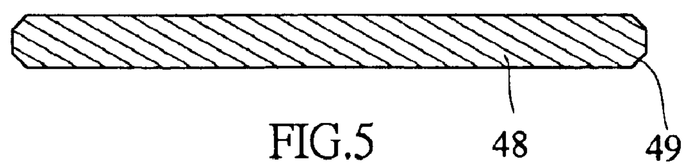
FIG. 5 is a second schematic illustrate showing a transparent layer of the present invention.

Please referring to FIG. 5, which is a second schematic illustrate showing a transparent layer of the present invention. Wherein the cut-corners49 of the transparent layer48 are an incline-shaped.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor to be electrically connected to a printed circuit board, comprising:

a substrate having an upper surface formed with a plurality of first connected points projecting over the upper surface and a lower surface;

a frame layer being arranged on the upper surface of the substrate so as to form a cavity together with the substrate;

a photosensitive chip being formed with a plurality of bonding pads and being mounted on the upper surface of the substrate and within the cavity;

a plurality of wires, each wire electrically connected the bonding pad of the photosensitive chip to the first connected point of the substrate; and a transparent layer covered on the frame layer for covering the photosensitive chip so that the photosensitive chip may receive optical signals passing through the transparent layer respectively, at the periphery of the transparent layer formed with cut—corner.

2. The image sensor according to claim 1, wherein the lower surface of the substrate has a plurality of second connected points for connecting the printed circuit board.

3. The image sensor according to claim 1, wherein the transparent layer is a piece of transparent glass.

4. The image sensor according to claim 1, wherein the cut-corner of the transparent layer is a spherical-shaped.

5. The image sensor according to claim 1, wherein the cut-corner of the transparent layer is an incline-shaped.

* * * * *